(12) United States Patent
Li et al.

(10) Patent No.: US 7,720,179 B2
(45) Date of Patent: May 18, 2010

(54) METHOD FOR TIMING DETECTION

(75) Inventors: Guogang Li, Shanghai (CN); Xuefeng Jiang, Fremont, CA (US); Qian Li, Shanghai (CN)

(73) Assignee: Marvell World Trade Ltd., St. Michael (BB)

( * ) Notice: Subject to any disclaimer, the term of this patent is extended or adjusted under 35 U.S.C. 154(b) by 966 days.

(21) Appl. No.: 11/417,778

(22) Filed: May 4, 2006

(65) Prior Publication Data
US 2006/0269018 A1 Nov. 30, 2006

Related U.S. Application Data

(60) Provisional application No. 60/685,152, filed on May 27, 2005.

(51) Int. Cl.
*H04L 27/00* (2006.01)
(52) U.S. Cl. .................. 375/326; 375/343; 375/327
(58) Field of Classification Search .............. 375/150, 375/326, 327, 343
See application file for complete search history.

(56) References Cited

U.S. PATENT DOCUMENTS

| | | | | |
|---|---|---|---|---|
| 5,471,501 A | * | 11/1995 | Parr et al. | 375/354 |
| 5,761,211 A | * | 6/1998 | Yamaguchi et al. | 714/707 |
| 5,793,818 A | * | 8/1998 | Claydon et al. | 375/326 |
| 5,844,948 A | * | 12/1998 | Ben-Efraim et al. | 375/344 |
| 5,893,032 A | * | 4/1999 | Maeda et al. | 455/412.1 |
| 6,032,033 A | * | 2/2000 | Morris et al. | 455/277.2 |
| 6,160,841 A | * | 12/2000 | Stansell et al. | 375/148 |
| 6,560,303 B1 | | 5/2003 | Fan et al. | |
| 6,590,872 B1 | * | 7/2003 | Shiue et al. | 370/314 |
| 6,597,733 B2 | * | 7/2003 | Pollmann et al. | 375/222 |
| 6,621,857 B1 | * | 9/2003 | Belotserkovsky et al. | 375/149 |
| 2002/0141482 A1 | * | 10/2002 | Agami et al. | 375/147 |
| 2003/0118081 A1 | * | 6/2003 | Philips et al. | 375/130 |
| 2004/0165656 A1 | * | 8/2004 | Shiue et al. | 375/150 |
| 2005/0141646 A1 | * | 6/2005 | Han | 375/326 |
| 2005/0286619 A1 | * | 12/2005 | Haddadin et al. | 375/222 |
| 2006/0098719 A1 | * | 5/2006 | Baltersee et al. | 375/148 |
| 2006/0132949 A1 | * | 6/2006 | Erden et al. | 360/31 |
| 2009/0109881 A1 | * | 4/2009 | Li et al. | 370/280 |

FOREIGN PATENT DOCUMENTS

WO WO 98/00992 A 1/1998

OTHER PUBLICATIONS

International Search Report from the PCT dated Oct. 17, 2006 for International Application No. PCT/US2006/017829; 5 pages.
Written Opinion of the International Searching Authority dated Oct. 17, 2006 for International Application No. PCT/US2006/017829; 5 pages.
High-Performance Coherent Demodulator LSIC for Wireless Personal Communications; Yoichi Matsumoto et al; IEEE Transactions on Vehicular Technology, vol. 45, No. 3, Aug. 1996; pp. 475-483.

* cited by examiner

*Primary Examiner*—Emmanuel Bayard

(57) ABSTRACT

A wireless communication system comprises a sampling module that samples a first portion and a second portion of a channel using a sampling time. A correlator module selectively correlates the first portion and the second portion, generates correlation samples, and calculates an offset based on the correlation samples. A timing module selectively adjusts the sampling time based on the offset.

39 Claims, 8 Drawing Sheets

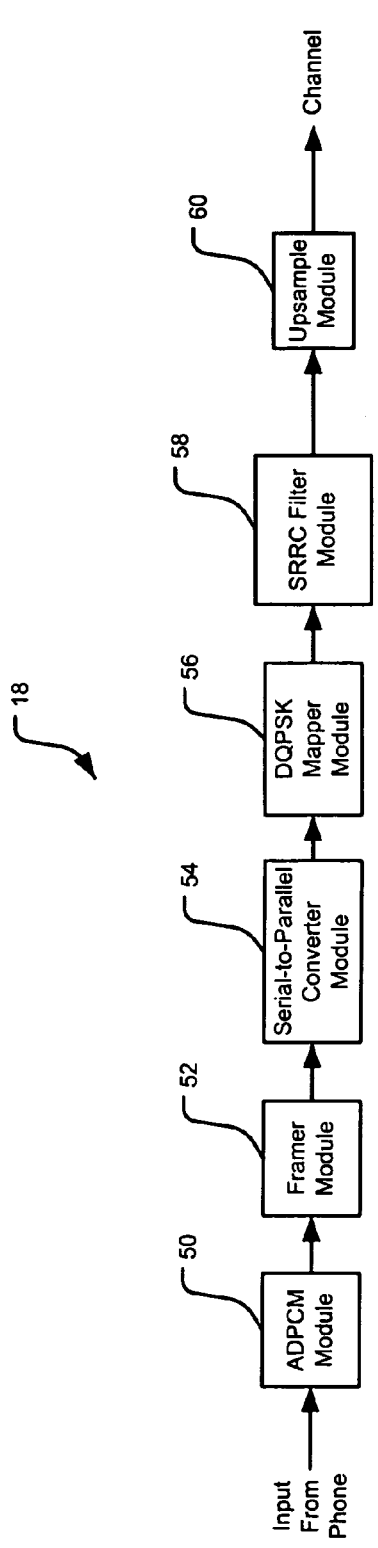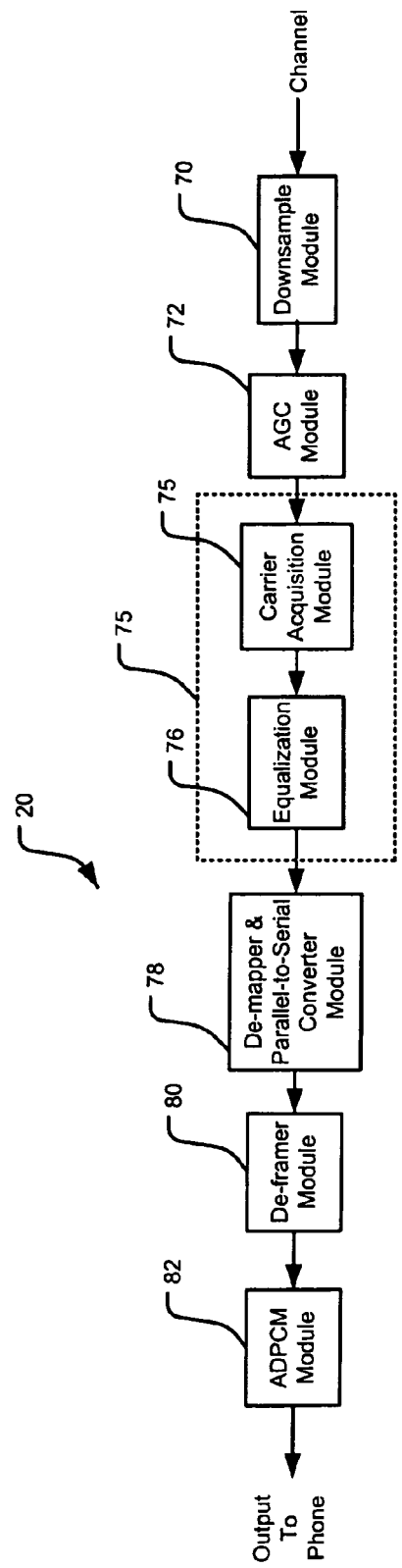
FIG. 2A
Prior Art
FIG. 2B
Prior Art

METHOD FOR TIMING DETECTION

CROSS-REFERENCE TO RELATED APPLICATIONS

This application claims the benefit of U.S. Provisional Application No. 60/685,152, filed on May 27, 2005. The disclosure of the above application is incorporated herein by reference in its entirety.

FIELD OF THE INVENTION

The present invention relates to communication systems, and more particularly to systems and methods for demodulating data in wireless communication systems.

BACKGROUND OF THE INVENTION

Personal Handy-phone System (PHS) is a mobile telephone system that operates in the 1.88-1.93 GHz frequency band. PHS is a cordless telephone system with capability to handover signals from one cell to another. PHS cells are smaller than cells of cellular phone systems that use Global System for Mobile communication (GSM).

Typically, PHS has a transmission power of 500 mW and a range of 10-100 meters. PHS provides service with minimal congestion in areas of heavy call-traffic such as business districts, downtown, etc. This is accomplished by installing cell stations at a radial distance of every 100-200 meters. Thus, PHS is particularly suitable for use in urban areas.

PHS-based phones can be used in homes, offices, and outdoors. PHS offers a cost-effective alternative to conventional phone systems that use ground lines. Additionally, PHS-based phones can interface with conventional phone systems. Thus, where ground lines of conventional phone systems cannot reach a physical location of a subscriber, the subscriber can use PHS to establish communication with the conventional phone system and reach other subscribers served by the conventional phone system.

PHS uses Time division multiple access (TDMA) as radio interface and adaptive differential pulse code modulation (ADPCM) as voice coder-decoder (codec). A codec includes an analog-to-digital converter (ADC) and a digital-to-analog converter (DAC) that translate signals between analog and digital formats.

TDMA is a digital signal transmission scheme that allows multiple users to access a single radio-frequency (RF) channel. Interference between channels is avoided by allocating unique time slots to each user within each channel. For example, a PHS frame comprises four channels: one control channel and three traffic channels. Each channel is divided into two time slots. The control channel assigns each caller one time slot for uplink or transmission and one time slot for downlink or reception.

Unlike PCM codecs that quantize speech signals directly, ADPCM codecs quantize a difference between a speech signal and a prediction made of the speech signal. If the prediction is accurate, the difference between actual and predicted speech may have a variance that is lower than the variance in actual speech. Additionally, the difference may be accurately quantized with fewer bits than the number of bits that would be needed to quantize the actual speech. While decoding, a quantized difference signal is added to a predicted signal to reconstruct an original speech signal. The performance of the codec is aided by using adaptive prediction and quantization so that a predictor and a difference quantizer adapt to changing characteristics of speech being coded.

Referring now to FIG. 1, an exemplary PHS phone 10 comprises an antenna 12, a signal processing module 16 comprising a transmit module 18 and a receive module 20, memory 22, a power supply 24, and an I/O module 26. The I/O module 26 may comprise various user-interfaces such as a microphone 26-1, a speaker 26-2, a display 26-3, a keypad 26-4, a camera 26-5, etc.

The transmit module 18 converts user input from the microphone 26-1, the camera 26-5, etc., into PHS-compatible signals. The receive module 20 converts data received from the antenna 12 into a user-recognizable format and outputs the same via speaker 26-2, camera 26-5, etc. The signal processing module 16 uses memory 22 to process data transmitted to and received from the antenna 12. The power supply 24 provides power to the phone 10.

Digital data is typically represented by zeros and ones, which are called bits. Data is generally transmitted by modulating amplitude, frequency, or phase of a carrier signal with a baseband information-bearing signal. Quadrature phase shift keying (QPSK) is a form of phase modulation generally used in communication systems. In QPSK, information bits are grouped in pairs called dibits. Thus, QPSK uses four symbols that represent dibit values 00, 01, 10, and 11. QPSK maps the four symbols to four fixed phase angles. For example, symbol 00 may be mapped to $(+3\pi/4)$. On the other hand, $\pi/4$-DQPSK uses differential encoding wherein mapping between symbols and phase angle varies. Additionally, $\pi/4$-DQPSK maps each of the four symbols to a real and an imaginary phase angle resulting in an eight-point constellation.

Referring now to FIGS. 2A-2B, the transmit module 18 comprises an ADPCM module 50, a framer module 52, a serial-to-parallel converter module 54, a DQPSK mapper module 56, a square-root raised cosine (SRRC) filter module 58, and an upsample module 60. The receive module 20 comprises a downsample module 70, an automatic gain control (AGC) module 72, a demodulator 75 comprising a carrier acquisition module 74 and an equalization module 76, a de-mapper and parallel-to-serial converter module 78, a de-framer module 80, and an ADPCM module 82.

When transmitting data from the phone 10 on a channel, the ADPCM module 50 converts audio and/or video signal into bits of digital data. The framer module 52 partitions the digital data into frames. The serial-to-parallel converter module 54 converts the bits in the frames into symbols. The DQPSK mapper module 56, which may utilize a modulation scheme such as $\pi/4$-DQPSK modulation, maps four real and four imaginary values of four symbols in each frame to a total of eight phase angles and generates a complex baseband signal.

The SRRC filter module 58, which is essentially a Nyquist pulse-shaping filter, limits the bandwidth of the signal. Additionally, the SRRC filter module 58 removes mixer products from the complex baseband signal. The upsample module 60 comprises a quadrature carrier oscillator that is used to convert the phase-modulated baseband signal into a phase-modulated carrier signal. The upsample module 60 transmits the phase-modulated carrier signal on the channel at a sampling frequency that is greater than twice the Nyquist frequency.

When the phone 10 receives a signal from the antenna 12, the downsample module 70 downsamples the signal using an asynchronous oscillator. The downsample module 70 down-converts the signal from the phase-modulated carrier signal to the phase modulated baseband signal. The AGC module 72 maintains the gain of the signal relatively constant despite variation in input signal strength due to transmission losses, noise, interference, etc.

The carrier acquisition module 74 demodulates the signal, retrieves carrier phase information, and decodes symbol values from the signal. The equalization module 76 corrects any distortion present in the signal. The de-mapper and parallel-to-serial converter module 78 de-maps and converts the demodulated signal into a serial bit-stream. The de-framer module 80 de-partitions the frames into digital data bits. The ADPCM module 82 converts the digital data bits into audio and/or video data and outputs the data to the speaker 26-2 and/or the display 26-3 of the phone 10.

SUMMARY OF THE INVENTION

A wireless communication system comprises a sampling module that samples a first portion and a second portion of a channel using a sampling time. A correlator module selectively correlates the first portion and the second portion, generates correlation samples, and calculates an offset based on the correlation samples. A timing module selectively adjusts the sampling time based on the offset.

In other features, the first portion is a preamble (PR) and the second portion is a unique word (UW). The correlator module selectively correlates the first portion and the second portion when the channel is a traffic channel. The timing module adjusts the sampling time based on the offset when the channel is a traffic channel. The timing module adjusts the sampling time based on the first portion when the channel is a control channel.

In other features, the correlation module generates a correlation waveform using the correlation samples, determines a peak of the correlation waveform, and calculates the offset based on a distance of the peak from one of the correlation samples.

In other features, the correlation module generates a correlation waveform using the correlation samples and determines a peak of the correlation waveform using parabolic curve fitting, and calculates the offset based on a distance of the peak from one of the correlation samples.

In other features, the correlator module correlates the first portion and the second portion for each time slot of the channel. The correlator module correlates using training symbols in the channel. The channel comprises a plurality of time slots and wherein the timing module calculates the offset for each of the time slots. The correlator module estimates a location of the second portion in a traffic channel based on the sampling time of a control channel and based on a burst detected in the control channel.

In other features, a burst detector module communicates with the sampling module, detects a burst in a control channel, and generates a burst-detect signal when a moving average of one of N phases is less than a predetermined threshold. The one of N phases is an array of Nth sample of every symbol in a signal sampled at a sampling rate of N samples per symbol, and N is an integer greater than 1. The burst-detect signal activates the timing module. A carrier offset estimator module communicates with the burst detector module and generates a carrier offset for a control channel when activated by the burst-detect signal.

In other features, a carrier recovery module communicates with the sampling module and uses a phase-locked loop (PLL) to recover a carrier signal from a sample output by the sampling module. The PLL is initialized with the carrier offset and wherein the carrier offset is update when the PLL locks for each time slot in the channel. A differential decoder module communicates with the carrier recovery module and decodes a symbol from the sample. The sampling module uses one of a cubic interpolator and a parabolic interpolator.

An output sample rate of the sampling module is equal to a symbol rate and wherein an input sample rate of the sampling module is an integer multiple of the symbol rate. A personal handy-phone system (PHS) receiver comprises the wireless communication system.

A wireless communication system comprises sampling means for sampling a first portion and a second portion of a channel using a sampling time. Correlator means selectively correlates the first portion and the second portion, generates correlation samples, and calculates an offset based on the correlation samples. Timing means selectively adjusts the sampling time based on the offset.

In other features, the first portion is a preamble (PR) and the second portion is a unique word (UW). The correlator means selectively correlates the first portion and the second portion when the channel is a traffic channel. The timing means adjusts the sampling time based on the offset when the channel is a traffic channel. The timing means adjusts the sampling time based on the first portion when the channel is a control channel. The correlation means generates a correlation waveform using the correlation samples, determines a peak of the correlation waveform, and calculates the offset based on a distance of the peak from one of the correlation samples. The correlation means generates a correlation waveform using the correlation samples and determines a peak of the correlation waveform using parabolic curve fitting, and calculates the offset based on a distance of the peak from one of the correlation samples.

In other features, the correlator means correlates the first portion and the second portion for each time slot of the channel. The correlator means correlates using training symbols in the channel. The channel comprises a plurality of time slots and wherein the timing means calculates the offset for each of the time slots.

In yet other features, the correlator means estimates a location of the second portion in a traffic channel based on the sampling time of a control channel and based on a burst detected in the control channel. Burst detector means communicates with the sampling means, detects a burst in a control channel, and generates a burst-detect signal when a moving average of one of N phases is less than a predetermined threshold, wherein the one of N phases is an array of Nth sample of every symbol in a signal sampled at a sampling rate of N samples per symbol, and N is an integer greater than 1. The burst-detect signal activates the timing means. Carrier offset estimator means communicates with the burst detector means and generates a carrier offset for a control channel when activated by the burst-detect signal. Carrier recovery means communicates with the sampling means and uses phase-locked loop (PLL) means for recovering a carrier signal from a sample output by the sampling means. The PLL is initialized with the carrier offset. The carrier offset is updated when the PLL locks for each time slot in the channel.

In other features, differential decoder means communicates with the carrier recovery means and decodes a symbol from the sample. The sampling means uses one of a cubic interpolator and a parabolic interpolator. An output sample rate of the sampling means is equal to a symbol rate and wherein an input sample rate of the sampling means is an integer multiple of the symbol rate. A personal handy-phone system (PHS) receiver comprising the wireless communication system.

A computer program executed by a processor for operating wireless communication system comprises sampling a first portion and a second portion of a channel using a sampling time; selectively correlating the first portion and the second portion; generating correlation samples; calculating an offset based on the correlation samples; selectively adjusting the sampling time based on the offset.

In other features, the first portion is a preamble (PR) and the second portion is a unique word (UW). The computer program selectively correlates the first portion and the second portion when the channel is a traffic channel. The computer program includes adjusting the sampling time based on the offset when the channel is a traffic channel. The computer program includes adjusting the sampling time based on the first portion when the channel is a control channel. The computer program includes generating a correlation waveform using the correlation samples; determining a peak of the correlation waveform; and calculating the offset based on a distance of the peak from one of the correlation samples.

In other features, the computer program includes generating a correlation waveform using the correlation samples; determining a peak of the correlation waveform using parabolic curve fitting, and calculating the offset based on a distance of the peak from one of the correlation samples. The computer program includes correlating the first portion and the second portion for each time slot of the channel. The computer program includes correlating using training symbols in the channel.

In other features, the channel comprises a plurality of time slots and further comprising calculating the offset for each of the time slots. The computer program includes estimating a location of the second portion in a traffic channel based on the sampling time of a control channel and based on a burst detected in the control channel. The computer program includes detecting a burst in a control channel; and generating a burst-detect signal when a moving average of one of N phases is less than a predetermined threshold. The one of N phases is an array of Nth sample of every symbol in a signal sampled at a sampling rate of N samples per symbol, and N is an integer greater than 1.

In other features, the computer program includes adjusting the sampling time when the burst-detect signal occurs. The computer program includes generating a carrier offset for a control channel when the burst-detect signal occurs. The computer program includes using a phase-locked loop to recover a carrier signal from a sample output. The computer program includes initializing the PLL with the carrier offset; and updating the carrier offset when the PLL locks for each time slot in the channel.

In other features, the computer program includes decoding a symbol from the sample. The computer program includes using one of a cubic interpolator and a parabolic interpolator. The computer program includes setting an output sample rate equal to a symbol rate; and setting an input sample rate equal to an integer multiple of the symbol rate.

In still other features, the systems and methods described above are implemented by a computer program executed by one or more processors. The computer program can reside on a computer readable medium such as but not limited to memory, non-volatile data storage and/or other suitable tangible storage mediums.

A computer method comprises sampling a first portion and a second portion of a channel using a sampling time; selectively correlating the first portion and the second portion; generating correlation samples; calculating an offset based on the correlation samples; selectively adjusting the sampling time based on the offset.

In other features, the first portion is a preamble (PR) and the second portion is a unique word (UW). The computer method selectively correlates the first portion and the second portion when the channel is a traffic channel. The computer method includes adjusting the sampling time based on the offset when the channel is a traffic channel. The computer method includes adjusting the sampling time based on the first portion when the channel is a control channel. The computer method includes generating a correlation waveform using the correlation samples; determining a peak of the correlation waveform; and calculating the offset based on a distance of the peak from one of the correlation samples.

In other features, the computer method includes generating a correlation waveform using the correlation samples; determining a peak of the correlation waveform using parabolic curve fitting, and calculating the offset based on a distance of the peak from one of the correlation samples. The computer method includes correlating the first portion and the second portion for each time slot of the channel. The computer method includes correlating using training symbols in the channel.

In other features, the channel comprises a plurality of time slots and further comprising calculating the offset for each of the time slots. The computer method includes estimating a location of the second portion in a traffic channel based on the sampling time of a control channel and based on a burst detected in the control channel. The computer method includes detecting a burst in a control channel; and generating a burst-detect signal when a moving average of one of N phases is less than a predetermined threshold. The one of N phases is an array of Nth sample of every symbol in a signal sampled at a sampling rate of N samples per symbol, and N is an integer greater than 1.

In other features, the computer method includes adjusting the sampling time when the burst-detect signal occurs. The computer method includes generating a carrier offset for a control channel when the burst-detect signal occurs. The computer method includes using a phase-locked loop to recover a carrier signal from a sample output. The computer method includes initializing the PLL with the carrier offset; and updating the carrier offset when the PLL locks for each time slot in the channel.

In other features, the computer method includes decoding a symbol from the sample. The computer method includes using one of a cubic interpolator and a parabolic interpolator. The computer method includes setting an output sample rate equal to a symbol rate; and setting an input sample rate equal to an integer multiple of the symbol rate.

In still other features, the systems and methods described above are implemented by a computer method executed by one or more processors. The computer method can reside on a computer readable medium such as but not limited to memory, non-volatile data storage and/or other suitable tangible storage mediums.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 2A is a functional block diagram of an exemplary transmitter used in a PHS phone of FIG. 1 according to the prior art;

FIG. 2B is a functional block diagram of an exemplary receiver used in a PHS phone of FIG. 1 according to the prior art;

DETAILED DESCRIPTION OF THE PREFERRED EMBODIMENTS

Figure 1:
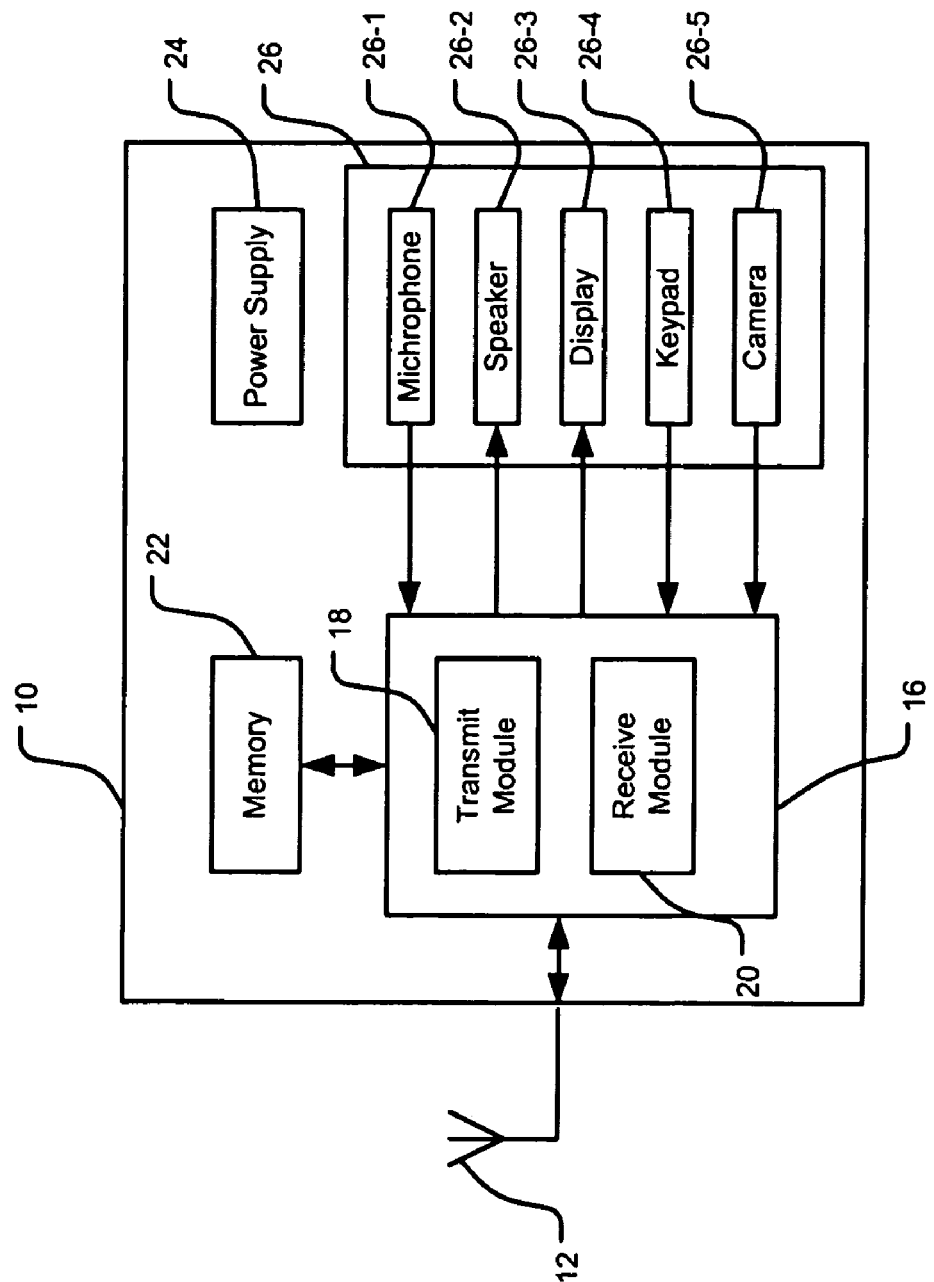
FIG. 1 is a functional block diagram of an exemplary personal handy-phone system (PHS) phone according to the prior art.

The following description of the preferred embodiment(s) is merely exemplary in nature and is in no way intended to limit the invention, its application, or uses. For purposes of clarity, the same reference numbers will be used in the drawings to identify similar elements. As used herein, the term module, circuit and/or device refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present invention.

The present disclosure is applicable to communications systems. For example, the present disclosure is applicable to wireless communications systems. The present disclosure is also applicable to time division multiple access (TDMA) systems. In the foregoing description, the present disclosure discusses a personal handy-phone system (PHS). However, the present disclosure is not meant to be limited to PHS or TDMA systems.

A receiver in a personal handy-phone system (PHS) phone estimates carrier phase (and frequency), recovers symbol timing, and estimates a most likely value of a received symbol. The receiver utilizes a symbol timing recovery scheme to estimate timing of symbols in a received signal. The receiver obtains correct values of symbols if the received signal is sampled at proper times.

A timing signal determines a time at which the received signal may be sampled to retrieve correct values of symbols. After the receiver identifies correct symbol timing, the receiver samples the received signal at the correct symbol timing. The receiver retrieves carrier and symbols from samples generated by sampling the received signal at the correct symbol timing and estimates most likely values of the symbols. Thereafter, the receiver converts the estimates into dibits.

Some symbol timing recovery schemes may use a phase difference between a current sample and a previous sample to determine symbol timing. If a phase estimate is wrong, however, the symbol values may be wrong since the receiver may be effectively using a different symbol mapping than a symbol mapping used by a transmitter while transmitting the symbols.

Some transmitters insert a fixed synchronization pattern into modulation when transmitting signals. The receiver searches for the pattern and correctly recovers symbols. This scheme, however, consumes bandwidth that can otherwise be used to carry data. Alternatively, the receiver can accurately recover symbols by using additional hardware. Adding hardware, however, may increase system cost and decrease system marketability.

In the present disclosure, a PHS receiver samples and recovers symbols from received signals with substantial accuracy by using a demodulation scheme that includes phase correlation, parabolic curve fitting, and interpolation using correct symbol timing. A signal received by the PHS receiver is downsampled at a sampling rate equal to three times a symbol rate. Thus, each symbol has three samples. The demodulation scheme identifies best of the three samples to demodulate. The best sample is decoded to obtain a correct value for each symbol.

Generally, a PHS signal comprises a series of time division multiple access (TDMA) frames. Each TDMA frame may be 5 milliseconds (mS) in duration with 2.5 mS for uplink or transmission and 2.5 mS for downlink or reception. Each TDMA frame may comprise four channels: one control channel and three traffic channels. Each channel has two time slots: one time slot for uplink and one time slot for downlink. Thus, each TDMA frame has a total of eight time slots.

The control channel uses a carrier frequency that is different from the carrier frequency (or frequencies) used by the traffic channels. The traffic channels can use same or different carrier frequencies.

Each TDMA frame comprises a preamble (PR) and a unique word (UW) for each channel. A UW includes identifying information for the PHS. The PHS uses UW as a security feature to authenticate access by subscribers to the PHS.

Typically, a TDMA signal is transmitted in bursts. A burst generally comprises an initial increase in amplitude from zero to a normal value followed by modulated data and a decrease in amplitude to zero. The burst is detected in the control channel, and bit timing is recovered for the control channel by utilizing a periodic pattern in the PR. The burst comprises a sequence of eight training symbols. The sequence is generally inserted in the middle of each time slot and is called a midamble. An equalizer in the PHS receiver uses the sequence to reduce inter-symbol interference.

Additionally, the demodulation scheme uses the training symbols for correlation in traffic channels. Based on the burst detection in the control channel and the bit timing of the control channel, an approximate position of the UW in traffic channels is determined. Substantially accurate bit timing for traffic channels is calculated by performing a phase correlation of PR and UW for each traffic channel. The phase correlation of PR and UW is performed using training symbols, and correlation samples are generated for each time slot. A correlation curve is generated using correlation samples for each time slot. The correlation curve is fitted onto a parabola, and a peak of the parabola is calculated.

The peak of the parabola approximately equals a peak of the correlation curve. The peak of the correlation curve corresponds to the best sample from which a symbol may be correctly decoded. An x-coordinate of the peak of the parabola corresponds to a best time to sample a symbol to get the correct value of the symbol.

Additionally, a distance between the peak of the parabola and an adjacent point on the correlation curve corresponds to a distance between the best sample and a sample adjacent to the best sample. A timing offset is calculated based on the distance between the peak of the parabola and the adjacent point on the correlation curve. A sampling time for sampling the symbols is adjusted by the timing offset. An interpolator, which is essentially a sampling module, uses adjusted sampling times to sample symbols at correct times. In other words, the demodulation scheme uses the peak of the parabola to estimate best times to sample subsequent symbols. Accordingly, best subsequent samples are demodulated and correct values of symbols are obtained therefrom.

Additionally, a carrier offset is estimated for the control channel, and a carrier phase is offset by an estimated carrier offset value. The estimated carrier offset value is calculated based on a first-order differentiation of a downsampled signal. Once carrier phase is offset and locked using automatic frequency control (AFC), subsequent samples are demodulated at correct times and are decoded to obtain substantially accurate values of the symbols.

For traffic channels, the AFC is initialized with the estimated carrier offset calculated for the control channel. A frequency step size of the AFC is decreased until the AFC locks. The estimated carrier offset is updated for each time slot. Samples are demodulated and decoded to obtain substantially accurate values of the symbols.

Figure 3:
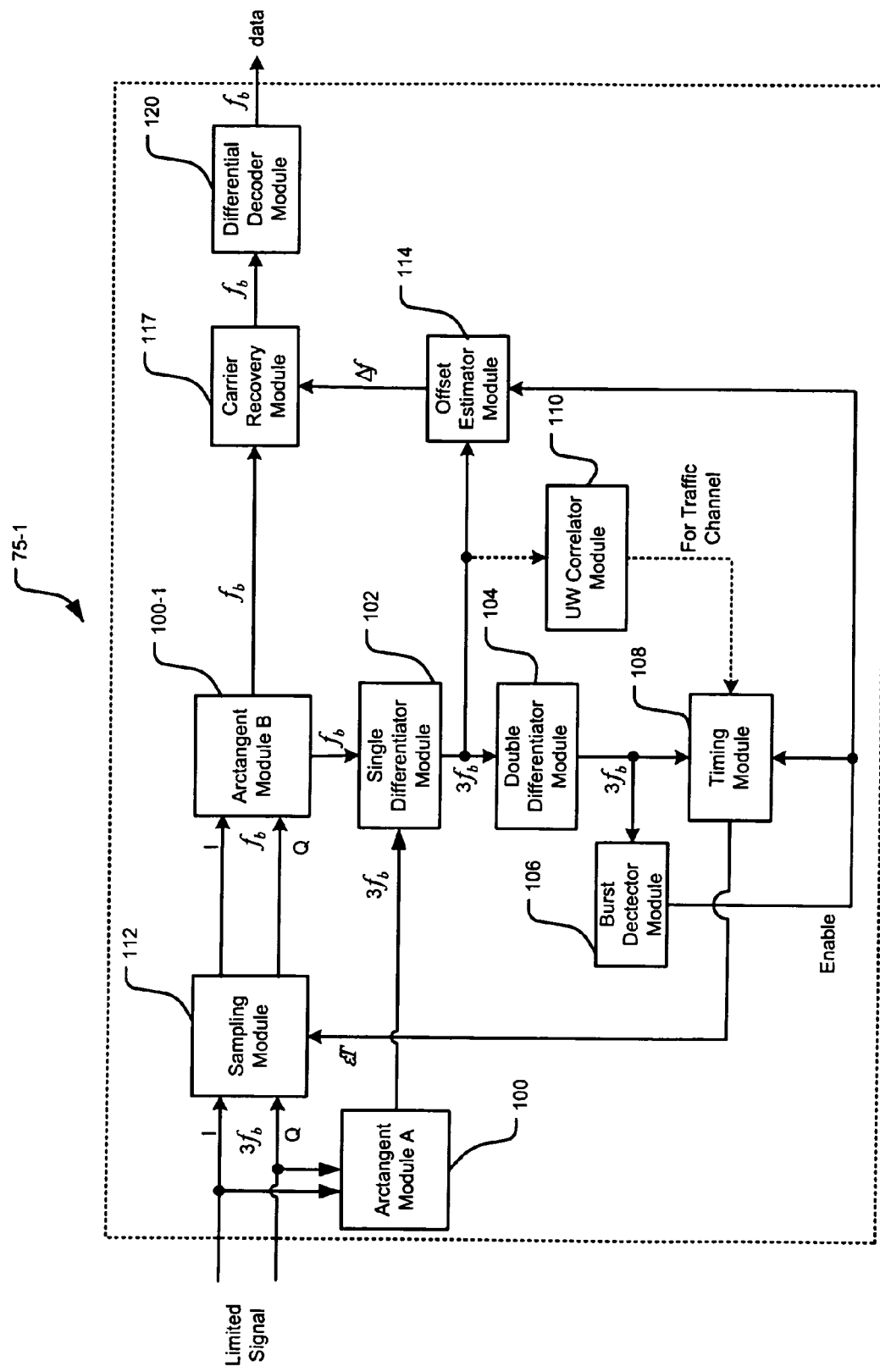
FIG. 3 is a functional block diagram of an exemplary demodulator used in a receiver of a PHS phone according to the present invention.

Referring now to FIG. 3, a demodulation system 75-1 of a PHS phone receiver comprises an arctangent module A 100, an arctangent module B 100-1, a single differentiator module 102, a double differentiator module 104, a burst detector module 106, a timing module 108, a UW correlator module 110, a sampling module 112, an offset estimator module 114, a carrier recovery module 117, and a differential decoder module 120.

The demodulation system 75-1 receives a signal that is downsampled at a rate of three samples per symbol ($3f_b$). An array of first samples of every symbol is called phase 1. An array of second samples for every symbol is called phase 2. An array of third samples of every symbol is called phase 3. The arctangent module A 100 receives the signal at the $3f_b$ rate. The arctangent module A 100 recovers a phase angle of the signal based on in-phase (I) and quadrature (Q) components of the signal. The arctangent module A 100 outputs the phase angle information for phase 1, phase 2, and phase 3 (collectively phases i) to the single differentiator module 102. This may be represented by arctangentOut(i-3), where i represents one of phases i.

The sampling module 112 interpolates the three samples of every symbol based on a sampling signal generated by the timing module 108. The sampling module 112 outputs one sample called best sample per symbol. Thus, output of the sampling module 112 is at the symbol rate ($f_b$).

The arctangent module B 100-1 receives the output of the sampling module 112. The arctangent module B 100-1 recovers a phase angle of the output of the sampling module 112 and outputs the phase angle information to the single differentiator module 102 and the carrier recovery module 117. The output of the arctangent module B 100-1 may be represented by arctangentOut(i).

The single differentiator module 102 and the double differentiator module 104 perform differentiation for each phase separately. For example, singleDiff (i)=arctangentOut (i)−arctangentOut (i−3). An output of the double differentiator module 104 is input to the burst detector module 106.

The burst detector module 106 detects a burst in the control channel. The burst detector module 106 adds two contiguous outputs of the double differentiator module 104 for phase i and calculates an absolute value of a sum of the two contiguous outputs. Moving averages of absolute values for each one of phases i are calculated and compared to a burst threshold ThB. The burst detector module 106 detects the burst if a moving average of any one of phases i is less than ThB.

The burst detector module 106 generates a burst-detect signal that enables the timing module 108 and the offset estimator module 114. The timing module 108 utilizes a periodic pattern in the preamble (PR) in the control channel instead of performing a phase correlation to recover bit timing. The timing module 108 determines bit timing and generates a correct sampling time for the control channel based on the PR in the control channel.

Burst detection is not performed in traffic channels because the PR in traffic channels is not as long as the PR in the control channel. Additionally, the timing module 108 cannot recover bit timing for traffic channels based on PR alone since the PR in traffic channels is not of sufficient length. Therefore, approximate bit timing for traffic channels is initially estimated based on the burst detection and the bit timing of the control channel.

An approximate position of the UW in traffic channels is determined based on the burst detection in the control channel and bit timing of the control channel. Thereafter, a phase correlation of PR and UW is performed for each traffic channel and a timing offset calculated. Substantially correct bit timing and sampling time for traffic channels are obtained by adjusting the approximate bit timing and sampling times of the control channel by the timing offset.

Specifically, the UW correlator module 110 performs the phase correlation of PR and UW for each traffic channel and generates correlation samples. The UW correlator module 110 generates a correlation curve using the correlation samples for each time slot of each traffic channel in a frame. The UW correlator module 110 performs a parabolic curve-fitting. That is, the correlation curve is fitted onto a parabola and a peak of the parabola is calculated. The peak of the parabola approximately corresponds to a peak of the correlation curve.

The UW correlator module 110 calculates the timing offset based on a distance between the peak of the parabola and an adjacent correlation sample on the correlation curve. The timing module 108 adjusts the bit timing and the sampling times of the traffic channels by the timing offset.

The sampling module 112 samples symbols in best of the three samples at sampling times generated by the timing module 108. The sampling module 112 essentially interpolates three samples comprising one symbol and samples the interpolated data at the correct sampling time generated by the timing module 108. The sampling module 112 effectively generates one sample called the best sample from the three samples, which yields a correct value of a symbol when decoded.

Thus, an output sample rate of the sampling module 112 is equal to the symbol rate. The symbol rate is determined by the number of symbols used in modulation and may be expressed as number of symbols per second. Additionally, by using the correct sampling times, the sampling module 112 can estimate substantially correct sampling times to sample subsequent symbols in the frame.

The offset estimator module 114 estimates a carrier offset for the control channel based on an output of the single differentiator module 102. The offset estimator module 114 stores the estimated carrier offset in a register. A carrier recovery module 117 utilizes automatic frequency control (AFC), which is essentially a phase-locked loop (PLL). The carrier recovery module 117 initializes the AFC with the estimated carrier offset.

Thereafter, the carrier recovery module 117 decreases a frequency step size of the AFC based on the estimated carrier offset. When the AFC is locked, the carrier recovery module 117 recovers the carrier signal from the best sample output by the sampling module 112 and generates a demodulated output comprising a correct value of the symbol. A differential decoder module 120 decodes the demodulated output and generates digital data represented by the symbol.

For traffic channels, the carrier recovery module 117 initializes the AFC with the estimated carrier offset calculated for the control channel. Thereafter, the carrier recovery module 117 decreases the frequency step size of the AFC based on the estimated carrier offset. Once the AFC is locked, the carrier recovery module 117 updates the estimated carrier offset for each time slot of each traffic channel. Alternatively, the frequency step size may be fixed, AFC may be performed for an entire input symbol sequence, and the estimated carrier offset may be updated at the end of each time slot.

When the AFC is locked, the carrier recovery module 117 recovers the carrier signal from the best sample output by the sampling module 112 and generates a demodulated output comprising the correct value of the symbol. The differential decoder module 120 decodes the demodulated output and generates digital data represented by the symbol.

Figure 4:
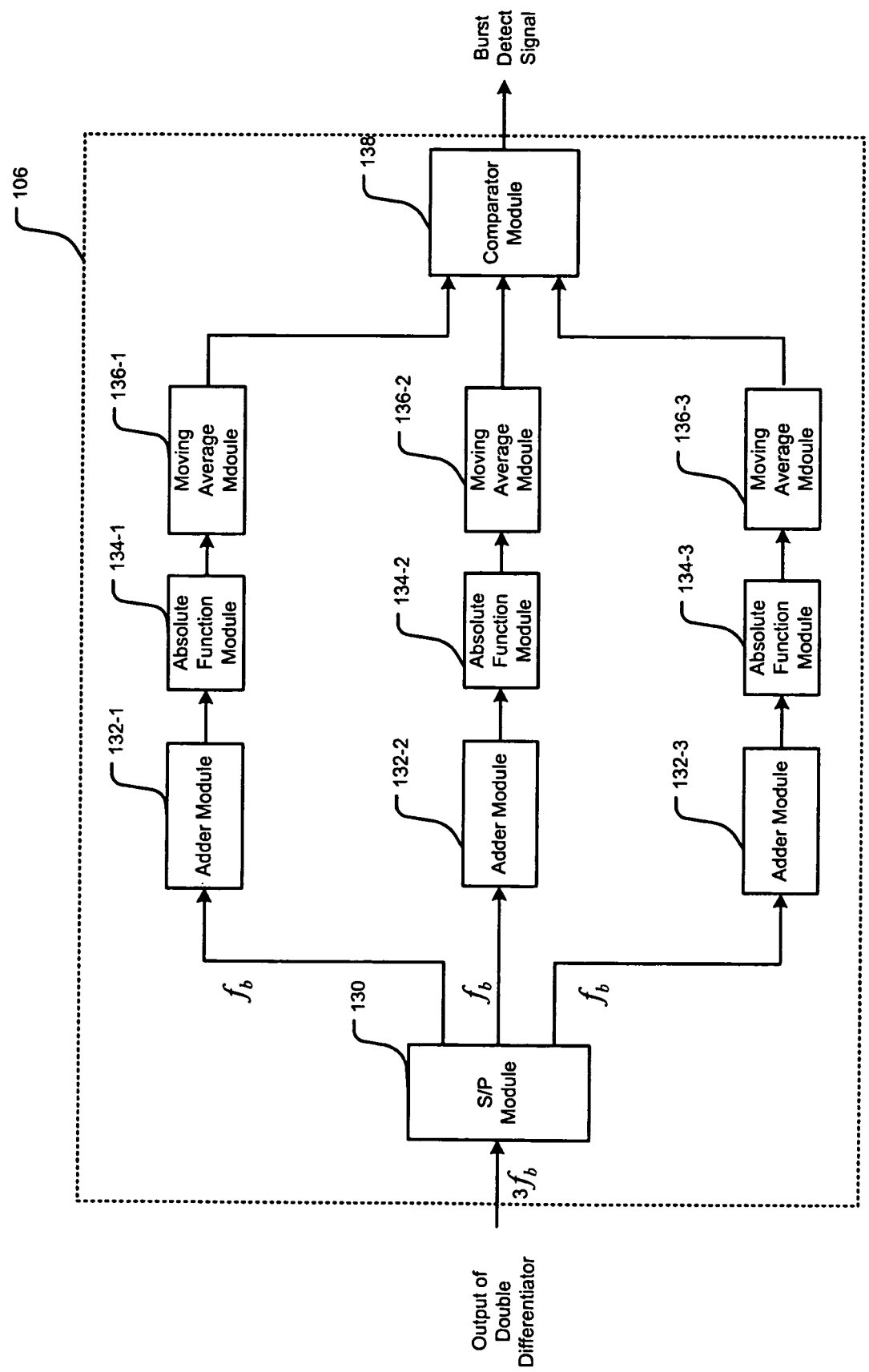
FIG. 4 is a functional block diagram of an exemplary burst detector used in the demodulator of FIG. 3 according to the present invention.

Referring now to FIG. 4, the burst detector module 106 detects the burst in the control channel. Specifically, an output of the double differentiator module 104 is input to a serial-to-parallel converter module 130, which separates phases i. Adder modules 132-1, 132-2, and 132-3 (collectively 132) add two contiguous outputs of the double differentiator module 104 for phases i. Absolute function modules 134-1, 134-2, 134-3 (collectively 134) calculate absolute values of outputs of respective adder modules 132. Moving average modules 136-1, 136-2, 136-3 (collectively 136) calculate moving averages of respective absolute values.

A comparator module 138 compares moving averages of phases i to a predetermined burst threshold ThB and generates the burst-detect signal if a moving average of one of the phases i is less than ThB. The burst-detect signal enables the timing module 108 and the offset estimator module 114.

The phase correlation, parabolic curve fitting, and interpolation performed by the demodulation system 75-1 can be mathematically explained as follows. For convenience, explanation is limited to time field. A signal received by the demodulation system 75-1 can be expressed by the following equation.

$$r(t) = A(t)e^{j2\pi\Delta ft + \phi(t-\epsilon T)} + n(t)$$

where A(t) is the amplitude of the signal, $\Delta f$ is the carrier offset, $\phi(t)$ is the phase information of the signal, $\epsilon$ is the bit timing offset, and n(t) is Gaussian white noise.

For $\pi/4$-DQPSK, the phase information $\phi(t)$ can be expressed as follows.

$$\phi(t) = \phi(t-T) + \theta(t)$$

where $\theta(t)$ is the phase angle mapped to symbols $(a_k, b_k)$ in the signal as shown in the following table.

| $(a_k, b_k)$ | $\theta(k)$ |
|---|---|
| (0, 0) | $\pi/4$ |
| (0, 1) | $3\pi/4$ |

-continued

| $(a_k, b_k)$ | $\theta(k)$ |
|---|---|
| (1, 1) | $-3\pi/4$ |
| (1, 0) | $-\pi/4$ |

After single differentiation by the single differentiator module 102, the phase information is given by the following equation.

$$\text{phsSingleDiff}(t) = \text{phaseRx}(t) - \text{phaseRx}(t-T) = 2\pi\Delta f T + \phi(t) - \phi(t-T)$$

After double differentiation by the double differentiator module 104, the phase information is given by the following equation.

$$\text{phsDoubleDiff}(t) = \text{phsSingleDiff}(t) - \text{phsSingleDiff}(t-T) = \phi(t) + \phi(t-2T) - 2\phi(t-T)$$

The burst detector module 106, the timing module 108, and the carrier recovery module 117 use algorithms that are based on a periodicity of the preamble PR. In the burst detector module 106, inputs to the comparator module 138 are given by following equations.

$$\text{sumBurst1} = \sum_{m=0}^{M-1} \text{abs}(phsDoubleDiff(t - mT) + phsDoubleDiff(t - mT - T))$$

$$\text{sumBurst2} = \sum_{m=0}^{M-1} \text{abs}(phsDoubleDiff(t - T/3 - mT) + phsDoubleDiff(t - T/3 - mT - T))$$

$$\text{sumBurst3} = \sum_{m=0}^{M-1} \text{abs}(phsDoubleDiff(t - 2T/3 - mT) + phsDoubleDiff(t - 2T/3 - mT - T))$$

If one of sumBurst1, sumBurst2, or sumBurst3 is less than a predetermined threshold ThB, the comparator module 138 generates a burst detect signal that enables the timing module 108 and the offset estimator module 114.

The timing module 108 performs bit timing recovery for the control channel and the traffic channels as follows. For the control channel, phsDoubleDiff(t) is a signal with a period of 2T. A sampling error, if any, may be expressed as phsDoubleDiff(t−ϵT). Expanding phsDoubleDiff(t−ϵT) using Fourier series, we get $$phsDoubleDiff(t - \varepsilon T) = a_0 + a_1\cos(2\pi f_0(t - \varepsilon T)) + b_1\sin(2\pi f_0(t - \varepsilon T)) + a_2\cos(2\pi \cdot 2f_0(t - \varepsilon T)) + b_2\sin(2\pi \cdot 2f_0(t - \varepsilon T)) + \cdots$$

where $$a_0 = 0,$$

$$a_n = \int_0^{2T} phsDoubleDiff(t) \cdot \cos(2\pi \cdot nf_0 t)dt \neq 0$$

$$b_n = \int_0^{2T} phsDoubleDiff(t) \cdot \sin(2\pi \cdot nf_0 t)dt = 0$$

-continued $$f_0 = \frac{1}{2T}$$

Therefore, $$phsDoubleDiff(t-\varepsilon T) = a_1\cos(2\pi f_0(t-\varepsilon T)) + a_2\cos(2\pi \cdot 2f_0(t-\varepsilon T)) + \cdots$$

The output of the timing module 108 for the control channel is given by the following equation.

$$\varepsilon = \frac{1}{\pi}\arctan\left(\frac{w}{u}\right)$$

where $$u = \int_0^{2T} phsDoubleDiff(t-\varepsilon T)\cdot\cos(2\pi\cdot 2f_0 t)dt$$

$$= \int_0^{2T} [a_1\cos(2\pi f_0(t-\varepsilon T)) + a_2\cos(2\pi\cdot 2f_0(t-\varepsilon T)) + \cdots ]\cdot$$

$$\cos(2\pi f_0)dt$$

$$= a_1\cdot 2T\cos(2\pi f_0\varepsilon T) = a_1\cdot 2T\cos\left(2\pi\frac{1}{2T}\varepsilon T\right)$$

$$= a_1\cdot 2T\cos(\pi\varepsilon)$$

and $$w = \int_0^{2T} phsDoubleDiff(t-\varepsilon T)\cdot\sin(2\pi\cdot 2f_0 t)dt$$

$$= \int_0^{2T} [a_1\cos(2\pi f_0(t-\varepsilon T)) + a_2\cos(2\pi\cdot 2f_0(t-\varepsilon T)) + \cdots ]\cdot$$

$$\sin(2\pi f_0 T)dt$$

$$= a_1\cdot 2T\sin(2\pi f_0\varepsilon T) = a_1\cdot 2T\sin\left(2\pi\frac{1}{2T}\varepsilon T\right)$$

$$= a_1\cdot 2T\sin(\pi\varepsilon)$$

On the other hand, for traffic channels, the length of the preamble PR is insufficient to perform burst detection and accurate bit timing recovery. Therefore, the UW correlator module 110 uses burst detection and bit timing information of the control channel to estimate UW position in traffic channels and performs phase correlation of PR and UW to determine the best phase. The AFC in the carrier recovery module 117 is locked using the best phase.

Initially, frequency offset information is removed from an output of the single differentiator module 102 as follows.

$$phsSingleDiff(t)=phaseRx(t)-phaseRx(t-T)=2\pi\Delta fT+\phi(t)-\phi(t-T)$$

Thereafter, the UW correlator module 110 performs correlation as follows.

$$Corr(t) = \int_{t-12T}^{t} (phsSingleDiff(t) - 2\pi\Delta fT) * UWmapping(t)dt$$

Figure 5:
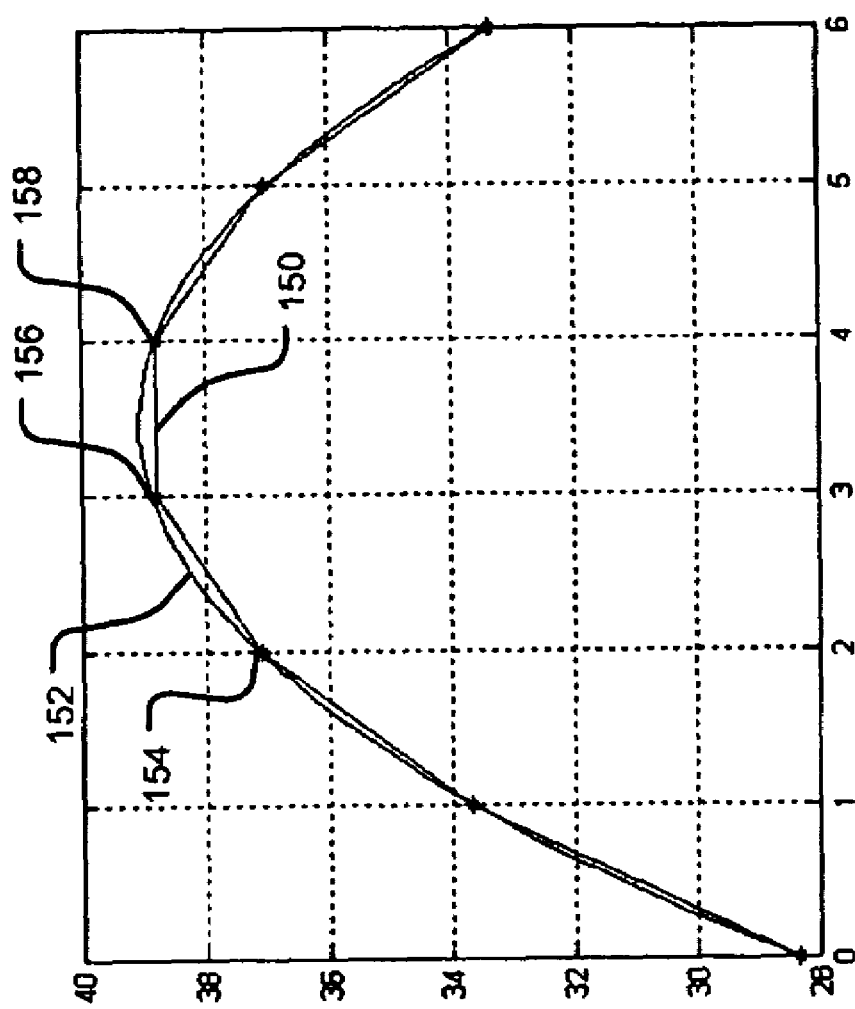
FIG. 5 is a graph showing a correlation curve with parabolic curve-fitting according to the present invention.

Referring now to FIG. 5, a correlation curve 150 is plotted for the correlation Corr(t). Since the peak of the correlation curve corresponds to the best phase, the correlation curve is fitted onto a parabola 152 for the purpose of finding the peak of the correlation curve. A parabola is expressed by the following equation.

$$y=ax^2+bx+c$$

where a, b, and c are the coefficients of the parabola. The peak of the parabola is calculated based on the coefficients by the following formula.

$$\varepsilon = -\frac{b}{2a}$$

The coefficients of the parabola 152 can be calculated based on coordinates of three points on the parabola 152: before peak 154, peak 156, and after peak 158. If the coordinates of the three points are $(x_1,y_1)=(0,y_1)$, $(x_2,y_2)=(1,y_2)$, $(x_2,y_2)=(2,y_2)$, the coefficients are given by the following equations.

$$a = \frac{y_1 - 2y_2 + y_3}{2}, \quad b = y_2 - y_1 - a, \quad c = y_1$$

After the peak of the parabola 152 is calculated based on the coefficients, an x-coordinate of the peak is determined. The x-coordinate of the peak of the parabola 152 corresponds to the best time to sample a symbol to get the correct value of the symbol.

The peak of the parabola 152 is used to estimate best samples. The correlation module 110 calculates a timing offset based on a distance between the peak of the parabola and an adjacent point on the correlation curve. The timing module 108 adjusts the bit timing and the sampling times of the traffic channels by the timing offset. The sampling module 112 interpolates the three samples, samples interpolated data at the sampling time adjusted by the timing module 108, and generates one sample that comprises the correct value of the symbol.

If the signal is noisy, a cubic interpolator may be used instead of a parabolic interpolator. For example, a 4-point cubic interpolator is mathematically expressed by the following equation.

$$y(n) = \sum_{i=I_1}^{I_2} C_i x(I_1 + I_2 - i)$$

where $I_1 = -2$, $I_2 = 1$, and $C_i = \prod_{j=I_1, j\neq i}^{I_2} \frac{t - t_j}{t_i - t_j}$ $$C_{-2} = \frac{1}{6}\mu^3 - \frac{1}{6}\mu$$

$$C_{-1} = -\frac{1}{2}\mu^3 + \frac{1}{2}\mu^2 + \mu$$

and now $$C_0 = \frac{1}{2}\mu^3 - \mu^2 - \frac{1}{2}\mu + 1$$

$$C_{-2} = -\frac{1}{6}\mu^3 + \frac{1}{2}\mu^2 - \frac{1}{3}\mu$$

Generally, μ is within [0,1). Therefore, if the peak ε of the parabola 152 is less than 0, then ε is modulated with osrRx so that ε is within [0,osrRx).

Figure 6:
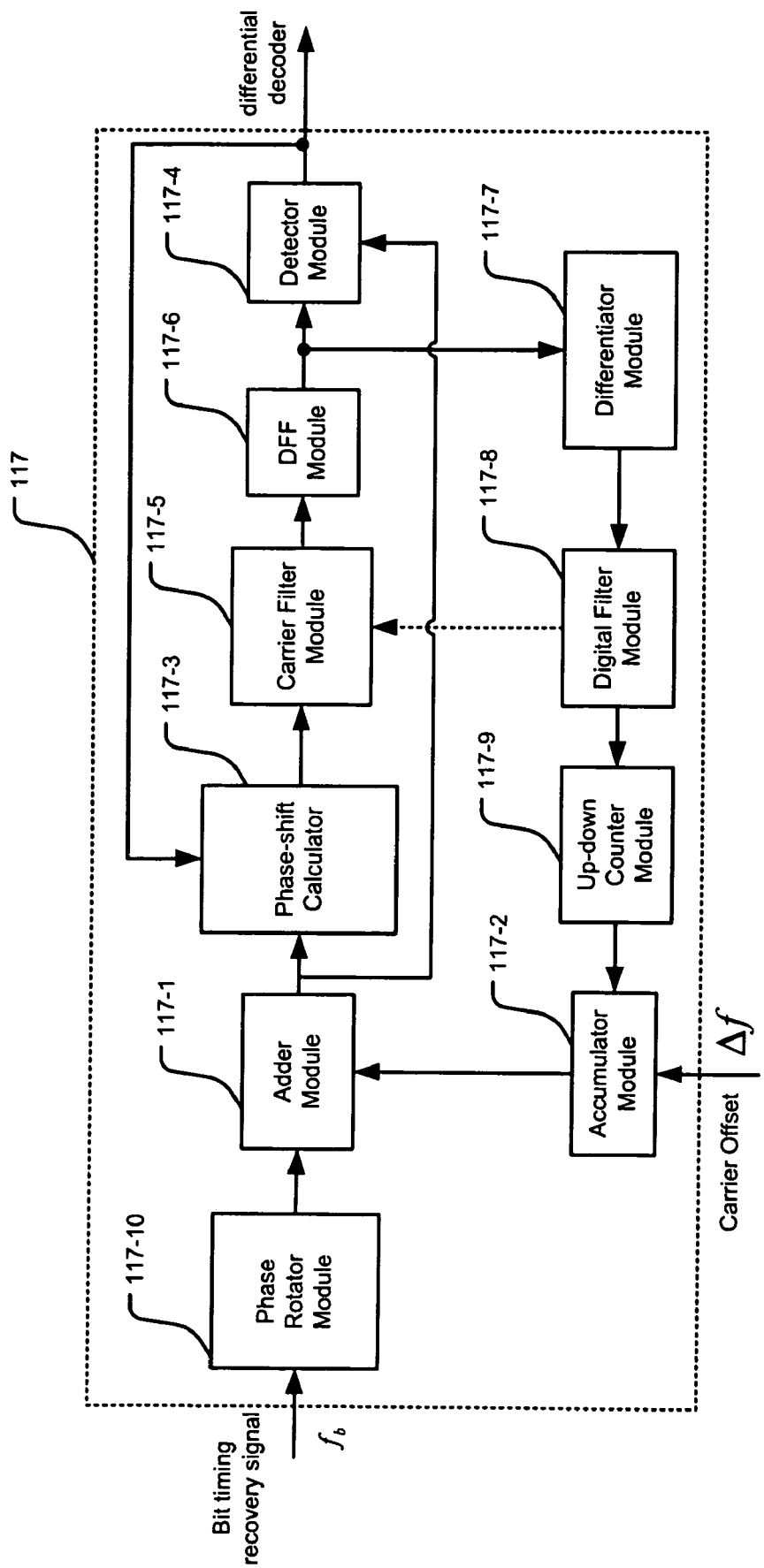
FIG. 6 is a functional block diagram of an exemplary carrier recovery module having automatic frequency control (AFC) that is used in the demodulator of FIG. 3 according to the present invention.

Referring now to FIG. 6, the carrier recovery module 117 utilizes a phase-locked loop (PLL) that performs automatic frequency control (AFC). The carrier recovery module 117 comprises a phase rotator module 117-10 that subtracts π/4 from a π/4-DQPSK signal and generates a DQPSK signal.

The carrier offset generated for the control channel by the offset estimator module 114 is input to an accumulator module 117-2. An adder module 117-1 adds an output of the accumulator module 117-2 to the DQPSK signal and outputs a sum to a phase-shift calculator module 117-3 and to a detector module 117-4. The phase-shift calculator module 117-3 calculates a carrier phase-shift. The detector module 117-4 detects codes and provides a feedback to the phase-shift calculator module 117-3.

The carrier phase-shift is filtered by a carrier filter module 117-5. The carrier filter module 117-5 may utilize a first-order filter. A filtered carrier phase-shift is input to a digital fixed frequency (DFF) module 117-6. An output of the DFF module 117-6 is input to the detector module 117-4 and to a differentiator module 117-7. The differentiator module 117-7 differentiates the output of the DFF module 117-6. A digital filter module 117-8 filters a differentiated signal output by the differentiator module 117-7 and provides a feedback to the carrier filter module 117-5. An up-down counter module 117-9 counts add times and subtract times and provides an output to the accumulator module 117-2. When add times and subtract times of the up-down counter module 117-9 are nearly equal, the AFC frequency is locked, and the carrier filter module 117-5 recovers the carrier signal.

The carrier recovery module 117 receives the carrier offset generated by the offset estimator module 114. The offset estimator module 114 calculates the carrier offset for the control channel based on an output of the single differentiator module 102. The output of the single differentiator module 102, phsSingleDiff(t), is a periodic function of period 2T and is expressed by the following equation.

phsSingleDiff(t)=phaseRx(t)−phaseRx(t−T)=2π∆fT+ φ(t)−φ(t−T)

The carrier offset is determined by the following equation.

$$\Delta f = \frac{\int_0^{0+2MT} (phsSingleDiff(t) - \pi/4) dt}{4\pi MT^2}$$

Offset estimation is improved by using burst detection performed by the burst detector module 106. An improved carrier offset is given by the following equation.

$$\Delta f = \frac{\sum_{m=0}^{m=2M-1} (phsSingleDiff(k+mT) - \pi/4)}{4\pi MT}$$

The improved carrier offset increases probability of selecting best samples for carrier recovery. The carrier recovery module 117 uses best samples to recover the carrier signal.

The carrier recovery module 117 decreases a frequency step size of the AFC using the following AFC algorithm. The AFC algorithm utilizes a characteristic of DQPSK. A relationship between DQPSK and π/4-DQPSK is shown in the following table.

| Transmitted signal | Phase difference | |
|---|---|---|
| | π/4 − DQPSK ∆θ(k) | DQPSK ∆θ(k) − π/4 |
| (0, 0) | π/4 | 0 |
| (0, 1) | 3π/4 | π/2 |
| (1, 1) | −3π/4 | π |
| (1, 0) | −π/4 | −π/2 |

A DQPSK signal can be obtained by subtracting π/4 from π/4-DQPSK signal. Therefore, the input signal is rotated by π/4 by the phase rotator module 117-10. This is mathematically expressed as follows.

$$\theta_{Pk} = \theta_{Rk} - k \cdot \pi/4$$
$$= \theta_{Tk} + \phi_{ek} + n_{ek} - k \cdot \pi/4$$
$$= I_k \cdot \pi/2 + \phi_{ek} + n_{ek}$$

where $I_k = I_{k-1} + I_T$, $\phi_{ek}$ is phase change caused by frequency offset, and $n_{ek}$ is phase change caused by Gaussian noise.

The carrier recovery module 117 initializes the AFC with a frequency offset within a small predetermined range. Thereafter, the carrier recovery module 117 decreases the frequency offset based on the improved carrier offset provided by the offset estimator module 114. When add times and subtract times of the up-down counter module 117-9 are nearly equal, the PLL is locked, and the carrier filter module 117-5 begins carrier recovery.

An equation for the carrier filter module 117-5 is expressed as follows.

$$\hat{\phi}_{ek} = \frac{1-\alpha}{1-\alpha z^{-1}} \phi'_{ek}$$

where $\phi'_{ek}$ is input phase error, $\hat{\phi}_{ek}$ is filtered phase error, $\alpha = \exp(-2/Q)$, and $Q_k = 10 \cdot k/N_f (k<N_f) = 10 (k>=N_f)$.

The carrier recovery module 117 comprises the phase-shift calculator module 117-3 that uses a feedback mechanism, which may be a form of reverse modulation. A code detected by the detector module 117-4 is fed back to the phase-shift calculator module 117-3. This eliminates a phase change caused by the phase information in the signal. This is mathematically expressed as follows.

$$\phi'_{ek} = (I_k - \hat{I}_k) \cdot \pi/2 + \phi_{ek} + n_{ek}$$

$\hat{I}$ can be obtained by the following equation.

$$\hat{I} = [(\theta_{Pk} - \hat{\phi}_{ek-1})/(\pi/2) + \frac{1}{2}]$$

Thereafter, the differential decoder module 120 decodes the output of the carrier recovery module 117. Thus, $\hat{I}_T = \hat{I}_k - \hat{I}_{k-1}$.

Figure 7:
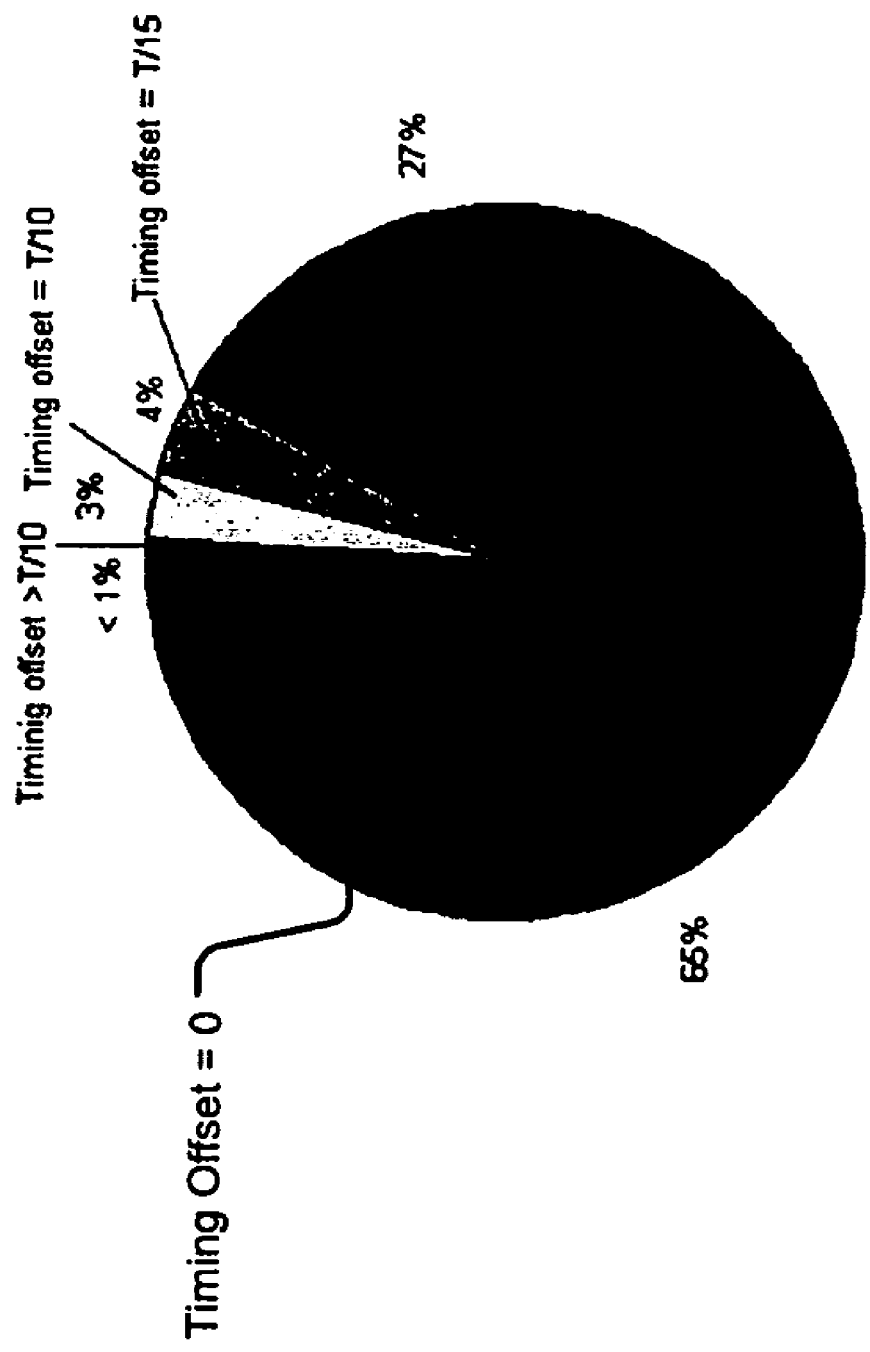
FIG. 7 is a pi-chart of exemplary simulation test results showing performance of the demodulator of FIG. 3 according to the present invention.

Referring now to FIG. 7, bit timing estimated using correlation, parabolic curve fitting, and interpolation may be accurate at least 65% of the time as compared to known accurate timing. This is shown in the pi-chart by the region having timing offset=0.

Figure 8:
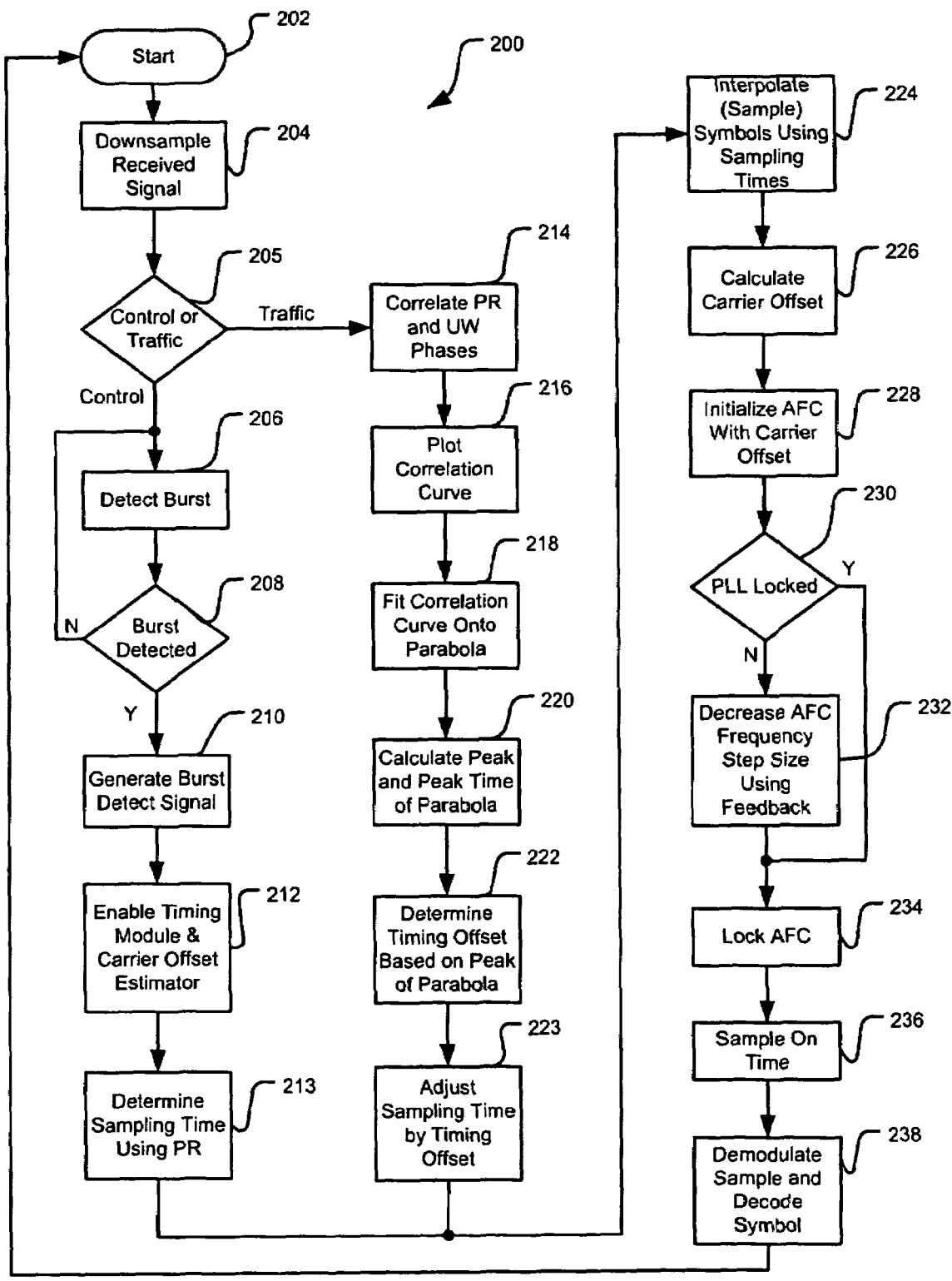
FIG. 8 is a flowchart for a method used by the demodulator of FIG. 3 to demodulate symbols according to the present invention.

Referring now to FIG. 8, a demodulation method 200 used in a PHS receiver begins at step 202. A downsample module 70 downsamples a signal received by the PHS receiver at a rate of three samples per symbol or $3f_b$ in step 204. Whether a channel is a control channel or a traffic channel is determined in step 205.

If the channel is control channel, a burst detector module 106 detects a burst in step 206. The burst detector module 106 determines if the burst is detected in step 208 based on whether moving average of one of three phases (phase 1, phase 2, or phase 3, wherein phase i is an array of i-th of three samples for every symbol) is less than a predetermined burst threshold ThB. If true, the burst detector module 106 generates a burst-detect signal in step 210. Otherwise, the burst detector module 106 continues to detect burst in step 206.

The burst-detect signal enables a timing module 108 and an offset estimator module 114 in step 212. The timing module 108 determines correct sampling time for the control channel in step 213 based on PR in the control channel. A sampling module 112 samples symbols in subsequent samples in step 224 using the sampling time generated by the timing module 108.

The offset estimator module 114 estimates a carrier offset in step 226. A carrier recovery module 117 initializes an AFC with an estimated value of carrier offset in step 228. The AFC checks in step 230 if a PLL is locked. If false, the carrier recovery module 117 decreases a frequency step size of the AFC in step 232. If true, the carrier recovery module 117 locks the AFC in step 234. The demodulation method 200 determines in step 236 that the sample is on time, that is, the sample is the best sample that comprises a correct symbol value. The demodulation system 75-1 demodulates the sample, and a differential decoder module 120 decodes a symbol from the sample in step 238. The method 200 restarts in step 202.

On the other hand, if the channel is traffic channel, a UW correlator module 110 correlates PR and UW phases in step 214 and generates a correlation curve in step 216 using correlation samples. To correlate UW, the correlator module 110 uses the burst detection and bit timing information of the control channel to estimate UW position in traffic channels.

The UW correlator module 110 fits the correlation curve to a parabola in step 218. The UW correlator module 110 calculates a peak of the parabola and a peak time based on an x-coordinate of the peak in step 220. The peak time represents the best time to sample a symbol. The UW correlator module 110 calculates a timing offset in step 222 based on a distance between the peak of the parabola and an adjacent point on the correlation curve.

The timing module 108 determines correct sampling time for the traffic channel in step 223 based on the timing offset. The sampling module 112 samples symbols in subsequent samples in step 224 using the sampling time generated by the timing module 108.

The offset estimator module 114 estimates the carrier offset for the control channel in step 226. To recover carrier in traffic channel, the carrier recovery module 117 initializes AFC with the estimated value of the carrier offset in step 228. The AFC checks in step 230 if the PLL is locked based on the carrier offset. If false, the carrier recovery module 117 decreases the frequency step size of the AFC in step 232. If true, the carrier recovery module 117 locks the AFC in step 234 and updates the carrier offset.

The demodulation method 200 determines in step 236 that the sample is on time, that is, the sample is the best sample that comprises a correct symbol value. The demodulation system 75-1 demodulates the sample, and a differential decoder module 120 decodes a symbol from the sample in step 238. The method 200 restarts in step 202.

As can be appreciated, the systems and methods disclosed herein may be used to determine bit timing in any communication system that utilizes TDMA. For example, the systems and methods disclosed herein may be used to determine bit timing in wireless communication systems, optical communication systems, etc.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A wireless communication system, comprising:
a sampling module that
receives an input,
samples a first portion and a second portion of a channel of said input using a sampling time, and
generates an output;
a correlator module that
selectively correlates said first portion and said second portion based on said input and said output,
generates correlation samples, and
calculates an offset based on said correlation samples;
a timing module that selectively adjusts said sampling time based on said offset.

2. A wireless communication system comprising:
a sampling module that samples a first portion and a second portion of a channel using a sampling time;
a correlator module that
selectively correlates said first portion and said second portion,
generates correlation samples, and
calculates an offset based on said correlation samples; and
a timing module that selectively adjusts said sampling time based on said offset,
wherein said correlator module estimates a location of said second portion in a traffic channel based on said sampling time of a control channel and based on a burst detected in said control channel.

3. The wireless communication system of claim 2, wherein said first portion is a preamble (PR) and said second portion is a unique word (UW).

4. The wireless communication system of claim 2, wherein said correlator module selectively correlates said first portion and said second portion when said channel is a traffic channel.

5. The wireless communication system of claim 2, wherein said timing module adjusts said sampling time based on said offset when said channel is a traffic channel.

6. The wireless communication system of claim 2, wherein said timing module adjusts said sampling time based on said first portion when said channel is a control channel.

7. The wireless communication system of claim 2, wherein said correlation module generates a correlation waveform using said correlation samples, determines a peak of said correlation waveform, and calculates said offset based on a distance of said peak from one of said correlation samples.

8. The wireless communication system of claim 2, wherein said correlation module generates a correlation waveform using said correlation samples, determines a peak of said correlation waveform using parabolic curve fitting, and calculates said offset based on a distance of said peak from one of said correlation samples.

9. The wireless communication system of claim 2, wherein said correlator module correlates said first portion and said second portion for each time slot of said channel.

10. The wireless communication system of claim 2, wherein said correlator module correlates using training symbols in said channel.

11. The wireless communication system of claim 2, wherein said channel comprises a plurality of time slots, and wherein said timing module calculates said offset for each of said time slots.

12. The wireless communication system of claim 2, wherein said sampling module uses one of a cubic interpolator and a parabolic interpolator.

13. The wireless communication system of claim 2, wherein an output sample rate of said sampling module is equal to a symbol rate, and wherein an input sample rate of said sampling module is an integer multiple of said symbol rate.

14. A personal handy-phone system (PHS) receiver comprising the wireless communication system of claim 2.

15. A wireless communication system comprising:
a sampling module that samples a first portion and a second portion of a channel using a sampling time;
a correlator module that
selectively correlates said first portion and said second portion,
generates correlation samples, and
calculates an offset based on said correlation samples;
a timing module that selectively adjusts said sampling time based on said offset; and
a burst detector module that
communicates with said sampling module,
detects a burst in a control channel, and
generates a burst-detect signal when a moving average of one of N phases is less than a predetermined threshold,
wherein said one of N phases is an array of Nth sample of every symbol in a signal sampled at a sampling rate of N samples per symbol, and N is an integer greater than 1.

16. The wireless communication system of claim 15 wherein said burst-detect signal activates said timing module.

17. The wireless communication system of claim 15 further comprising a carrier offset estimator module that communicates with said burst detector module and that generates a carrier offset for a control channel when activated by said burst-detect signal.

18. The wireless communication system of claim 17 further comprising a carrier recovery module that communicates with said sampling module and that uses a phase-locked loop (PLL) to recover a carrier signal from a sample output by said sampling module.

19. The wireless communication system of claim 18 wherein said PLL is initialized with said carrier offset and wherein said carrier offset is update when said PLL locks for each time slot in said channel.

20. The wireless communication system of claim 18 further comprising a differential decoder module that communicates with said carrier recovery module and that decodes a symbol from said sample.

21. A method for operating a wireless communication system, the method comprising:
receiving an input;
sampling a first portion and a second portion of a channel of said input using a sampling time and generating an output, wherein said wireless communication system communicates via said channel;
selectively correlating said first portion and said second portion based on said input and said output;
generating correlation samples;
calculating an offset based on said correlation samples; and
selectively adjusting said sampling time based on said offset.

22. A method for operating a wireless communication system, the method comprising:
sampling a first portion and a second portion of a channel using a sampling time, wherein said wireless communication system communicates via said channel;
selectively correlating said first portion and said second portion;
generating correlation samples;
calculating an offset based on said correlation samples;
selectively adjusting said sampling time based on said offset; and
estimating a location of said second portion in a traffic channel based on said sampling time of a control channel and based on a burst detected in said control channel.

23. The method of claim 22, wherein said first portion is a preamble (PR) and said second portion is a unique word (UW).

24. The method of claim 22 further comprising selectively correlating said first portion and said second portion when said channel is a traffic channel.

25. The method of claim 22 further comprising adjusting said sampling time based on said offset when said channel is a traffic channel.

26. The method of claim 22 further comprising adjusting said sampling time based on said first portion when said channel is a control channel.

27. The method of claim 22 further comprising:
generating a correlation waveform using said correlation samples;
determining a peak of said correlation waveform; and
calculating said offset based on a distance of said peak from one of said correlation samples.

28. The method of claim 22 further comprising:
generating a correlation waveform using said correlation samples;
determining a peak of said correlation waveform using parabolic curve fitting, and
calculating said offset based on a distance of said peak from one of said correlation samples.

29. The method of claim 22 further comprising correlating said first portion and said second portion for each time slot of said channel.

30. The method of claim 22 further comprising correlating using training symbols in said channel.

31. The method of claim 22 wherein said channel comprises a plurality of time slots and further comprising calculating said offset for each of said time slots.

32. The method of claim 22 further comprising using one of a cubic interpolator and a parabolic interpolator.

33. The method of claim 22 further comprising:
setting an output sample rate equal to a symbol rate; and
setting an input sample rate equal to an integer multiple of said symbol rate.

34. A method for operating a wireless communication system, the method comprising:
sampling a first portion and a second portion of a channel using a sampling time, wherein said wireless communication system communicates via said channel;

selectively correlating said first portion and said second portion;
generating correlation samples;
calculating an offset based on said correlation samples;
selectively adjusting said sampling time based on said offset;
detecting a burst in a control channel; and
generating a burst-detect signal when a moving average of one of N phases is less than a predetermined threshold, wherein said one of N phases is an array of Nth sample of every symbol in a signal sampled at a sampling rate of N samples per symbol, and N is an integer greater than 1.

35. The method of claim 34 further comprising adjusting said sampling time when said burst-detect signal occurs.

36. The method of claim 34 further comprising generating a carrier offset for a control channel when said burst-detect signal occurs.

37. The method of claim 36 further comprising using a phase-locked loop (PLL) to recover a carrier signal from a sample output.

38. The method of claim 37 further comprising:
initializing said PLL with said carrier offset; and
updating said carrier offset when said PLL locks for each time slot in said channel.

39. The method of claim 37 further comprising decoding a symbol from said sample.

* * * * *